(12) United States Patent
Durlam et al.

(10) Patent No.: US 7,432,150 B2
(45) Date of Patent: Oct. 7, 2008

(54) METHOD OF MANUFACTURING A MAGNETOELECTRONIC DEVICE

(75) Inventors: Mark A. Durlam, Chandler, AZ (US); Gloria J. Kerszykowski, Fountain Hills, AZ (US); Nicholas D. Rizzo, Gilbert, AZ (US); Eric J. Salter, Scottsdale, AZ (US); Loren J. Wise, Tempe, AZ (US)

(73) Assignee: EverSpin Technologies, Inc., Chandler, AZ (US)

( * ) Notice: Subject to any disclaimer, the term of this patent is extended or adjusted under 35 U.S.C. 154(b) by 160 days.

(21) Appl. No.: 11/351,610

(22) Filed: Feb. 10, 2006

(65) Prior Publication Data
US 2007/0190669 A1  Aug. 16, 2007

(51) Int. Cl.
*H01L 21/8234* (2006.01)
*H01L 21/8244* (2006.01)

(52) U.S. Cl. .................... 438/238; 438/3; 438/197; 257/E21.4; 257/E21.248; 257/E21.436; 257/E21.546; 257/E21.645

(58) Field of Classification Search ............... 439/197, 439/238, 3, 241, 258, 270, 514, 700
See application file for complete search history.

(56) References Cited

U.S. PATENT DOCUMENTS

| | | |
|---|---|---|
| 5,940,319 A | 8/1999 | Durlam et al. |
| 5,956,267 A | 9/1999 | Hurst et al. |
| 6,153,443 A | 11/2000 | Durlam et al. |
| 6,174,737 B1 | 1/2001 | Durlam et al. |
| 6,211,090 B1 | 4/2001 | Durlam et al. |
| 6,430,084 B1 | 8/2002 | Rizzo et al. |
| 6,430,085 B1 | 8/2002 | Rizzo |
| 6,720,597 B2 | 4/2004 | Janesky et al. |

*Primary Examiner*—David Nhu
(74) *Attorney, Agent, or Firm*—Bryan Cave LLP

(57) ABSTRACT

A method of manufacturing a magnetoelectronic device includes providing an electrically conducting material and an electrically insulating material adjacent to at least a portion of the electrically conducting material, and implanting a magnetic material into the electrically insulating material. The magnetic material increases the magnetic permeability of the electrically insulating material. The implant may be a blanket or a targeted implant.

20 Claims, 4 Drawing Sheets

METHOD OF MANUFACTURING A MAGNETOELECTRONIC DEVICE

FIELD OF THE INVENTION

This invention relates generally to magnetoelectronic devices, and relates more particularly to a method of improving the performance of magnetoelectronic devices.

BACKGROUND OF THE INVENTION

Magnetoelectronic devices found in semiconducting manufacturing have their performance limited by the use of standard dielectric films such as tetra ethyl ortho silicate (TEOS), plasma-enhanced nitride (PEN), and other materials with high dielectric constants. Such dielectric films are classified as diamagnetic, and do not significantly alter magnetic properties of magnetoelectronic devices. Dielectric films with enhanced magnetic permeability would improve the performance of magnetoelectronic devices. Accordingly, there exists a need for a method of increasing the magnetic permeability of a magnetoelectronic device.

BRIEF DESCRIPTION OF THE DRAWINGS

The invention will be better understood from a reading of the following detailed description, taken in conjunction with the accompanying figures in the drawings in which.

Figure 1:
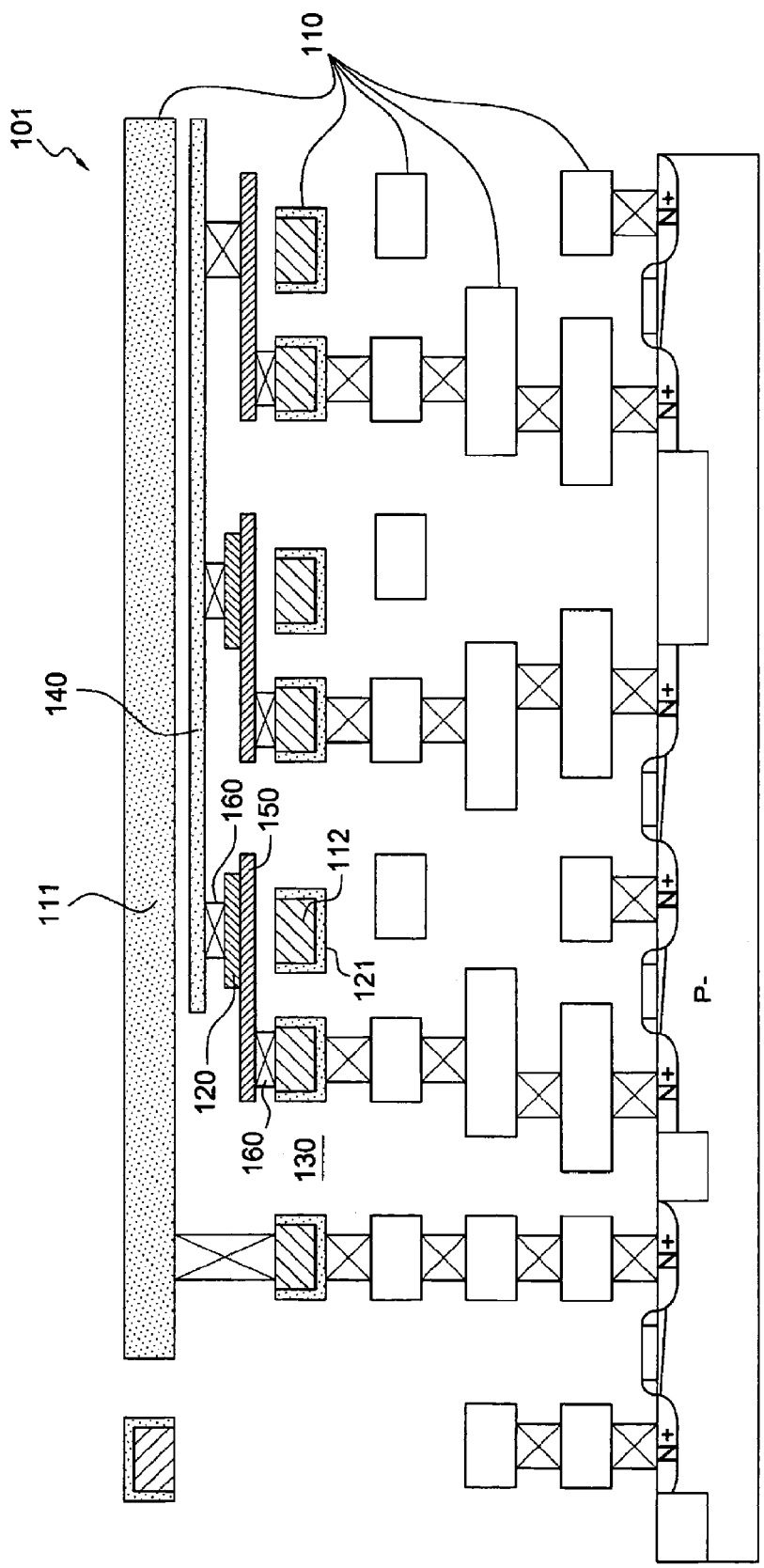
FIG. 1 is a cross-sectional view of a magnetoelectronic device that has been formed according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under,"in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a method of manufacturing a magnetoelectronic device comprises providing an electrically conducting material and an electrically insulating material adjacent to at least a portion of the electrically conducting material, and implanting a magnetic material into the electrically insulating material. The magnetic material increases the magnetic permeability of the electrically insulating material in a way that is consistent with standard CMOS processing.

The increased magnetic permeability achieved by ion implantation of magnetic materials leads to several desirable results. In the case of a magnetoresistive memory element such as MRAM, the increased magnetic permeability reduces the required write current, thus lowering the power required for operation. In the case of other magnetoelectronic devices such as inductors, transformer, and magnetic sensors, the increased magnetic permeability improves device performance by increasing magnetic coupling.

Referring now to the figures, FIG. 1 is a cross-sectional view of a magnetoelectronic device 100 that has been formed according to an embodiment of the invention. As an example, magnetoelectronic device 100 can be a magnetoresistive memory device, a passive device such as an inductor or transformer, a magnetic sensor, or the like. In the illustrated embodiment, magnetoelectronic device 100 is a magnetoresistive memory cell 101.

As illustrated in FIG. 1, magnetoresistive memory cell 101 comprises a plurality 110 of metal layers, including at least a first program line, also referred to herein as a bit line 111, and a second program line, also referred to herein as a digit line 112. Digit line 112 comprises a cladding layer 121, the purpose of which will be described below. Although it is not illustrated in FIG. 1, bit line 111 may also include a cladding layer, as shown in a subsequent figure.

Magnetoresistive memory cell 101 also comprises a memory element 120, also referred to herein as a magnetic tunnel junction (MTJ) bit, located between digit line 112 and bit line 111, and a spacer material 130 between bit line 111 and the memory element and between the memory element and digit line 112. In the embodiment illustrated in FIG. 1, spacer material 130 comprises an electrically insulating material that makes up an interlayer dielectric (ILD) film. As an example, the electrically insulating material can comprise a standard dielectric film such as TEOS, PEN, or the like. Magnetoresistive memory cell 101 further comprises a top electrode 140, a bottom electrode 150, and vias 160.

Figure 2:
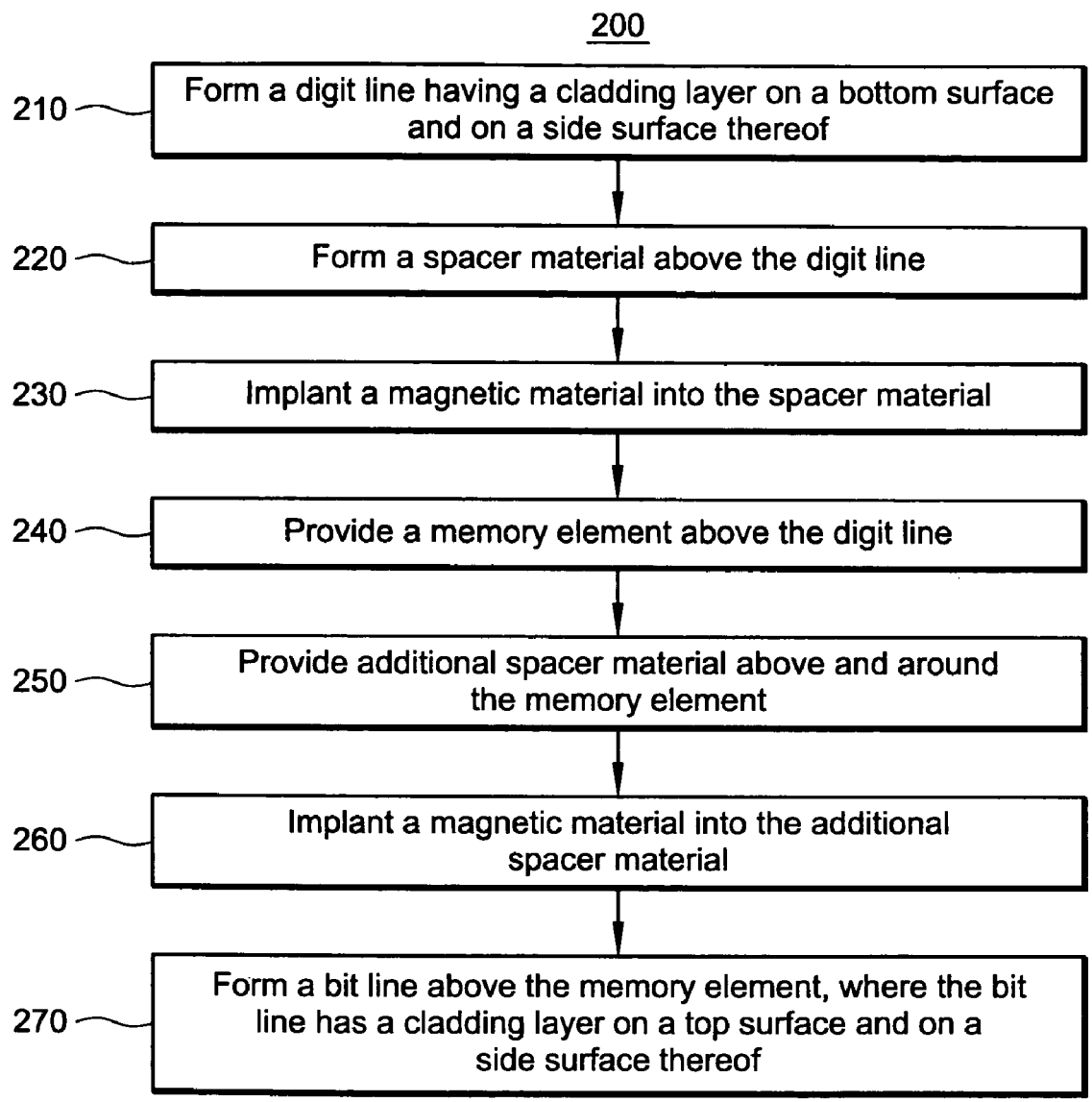
FIG. 2 is a flowchart illustrating a method of manufacturing a magnetoresistive memory cell according to an embodiment of the invention.

FIG. 2 is a flowchart illustrating a method 200 of manufacturing a magnetoresistive memory cell having enhanced magnetic permeability according to an embodiment of the invention. It should be understood that the order of steps in FIG. 2 is not necessarily the only order of such steps that would produce a valuable product according to an embodiment of the invention. In general, and as discussed in more detail below, method 200 includes steps of: providing a magnetoresistive memory cell comprising a plurality of metal layers including at least a digit line and a bit line, a memory element between the digit line and the bit line, and a spacer material between the bit line and the memory element and between the memory element and the digit line; implanting a magnetic material into the spacer material such that the magnetic material increases the magnetic permeability of the spacer material; and forming a first cladding layer on a bottom surface and on a side surface of the digit line and forming a second cladding layer on a top surface and on a side surface of the bit line.

As illustrated in FIG. 2, a step 210 of method 200 is to form a digit line having a cladding layer on a bottom surface and on a side surface or side surfaces thereof. As an example, the digit line can be similar to digit line 112, first shown in FIG. 1. As another example, the cladding layer can be similar to cladding layer 121, first shown in FIG. 1.

A person of ordinary skill in the art will recognize that program lines having cladding layers require less program current, also called write current, and are less affected by disturb mechanisms than program lines without cladding layers. Cladding layers on program lines focus the magnetic flux produced by the write current, thus increasing efficiency while reducing power requirements. The composition and the formation of the cladding layers are not described herein because such details are known in the art.

A step 220 of method 200 is to form a spacer material above the digit line. As an example, the spacer material can be similar to spacer material 130, first shown in FIG. 1. The formation of dielectric materials and other spacer materials is well known in the art, and is thus not further described herein.

A step 230 of method 200 is to implant a magnetic material into the spacer material formed in step 220 such that the magnetic material increases the magnetic permeability of the spacer material. As an example, and as further discussed below, step 230 can comprise a blanket implant or it can comprise a targeted implant of the magnetic material. In either case, the resulting concentration of magnetic material within the spacer material should be between approximately 5 percent and approximately 30 percent by atomic weight of the spacer material. A concentration of magnetic material of between approximately 15 percent and approximately 25 percent by atomic weight of the spacer material may result in better performance than concentrations outside this range.

The increase in magnetic permeability is achieved by ion implantation of iron, cobalt, or nickel, as well as alloys of these implant species. Iron, cobalt, nickel, and their alloys represent the magnetic material referred to in the foregoing discussion. The implantation is accomplished using implant techniques that are known in the art. Multiple implants may be used if necessary to achieve a desired result. Current testing suggests that iron and cobalt, and their alloys, are better than nickel at increasing magnetic permeability of magneto-electronic devices.

A step 240 of method 200 is to provide a memory element above the digit line. As an example, the memory element can be similar to memory element 120, first shown in FIG. 1, and can be formed in accordance with methods known in the art.

A step 250 of method 200 is to provide additional spacer material, which as an example can be similar to spacer material 130 (see FIG. 1), above and around the memory element.

A step 260 of method 200 is to implant a magnetic material into the spacer material formed in step 250 such that the magnetic material increases the magnetic permeability of the spacer material. The magnetic material implanted in step 260 can be, but need not necessarily be, the same material as that implanted in step 230. In either case, the discussion set forth above in connection with step 230 also applies to this step 260.

A step 270 of method 200 is to form a bit line above the memory element, where the bit line has a cladding layer on a top surface and on a side surface or side surfaces thereof. As an example, the bit line can be similar to bit line 111, first shown in FIG. 1. The discussion set forth above in connection with step 210 also applies to this step 270.

Method 200, as stated above, describes a process for manufacturing a magnetoresistive memory cell having enhanced magnetic permeability according to an embodiment of the invention. More generally, the same or another embodiment of the invention includes the steps of: (1) providing an electrically conducting material and an electrically insulating material adjacent to at least a portion of the electrically conducting material; and (2) implanting a magnetic material into the electrically insulating material. As has already been explained, the magnetic material increases the magnetic permeability of the electrically insulating material, thus improving the performance of the magnetic device formed by the method under discussion. It will be understood that the discussion of method 200 omits certain steps that are well known, such as, but not necessarily limited to, the formation of electrical contacts above and below the memory element.

Figure 3:
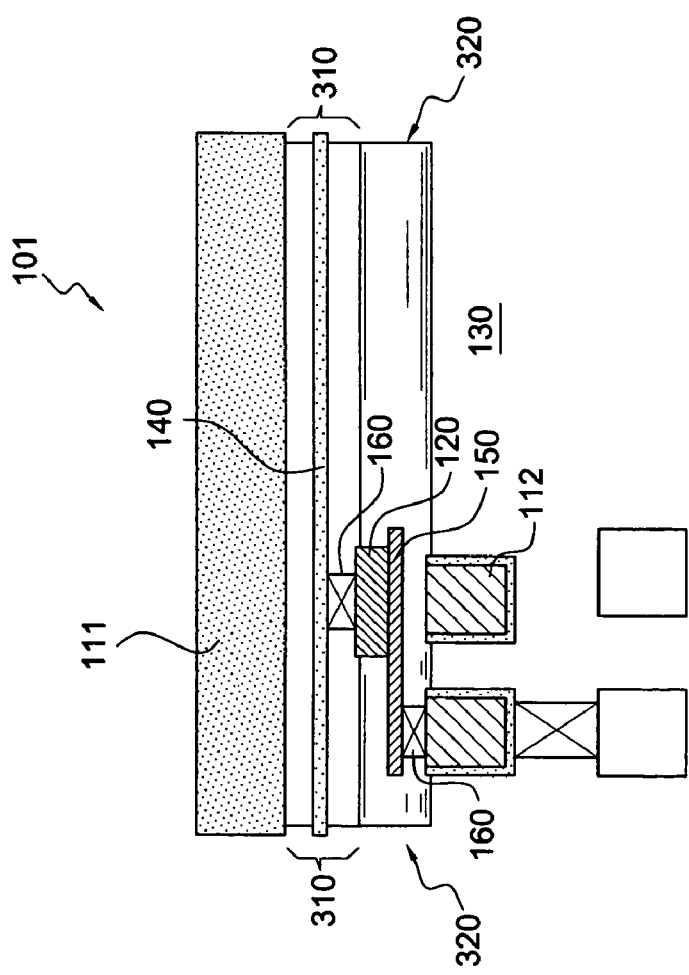
FIG. 3 is a cross sectional detail view of a portion of the magnetoelectronic device that was first shown in FIG. 1 according to an embodiment of the invention.

FIG. 3 is a cross sectional detail view of a portion of magnetoresistive memory cell 101 that was first shown in FIG. 1 according to an embodiment of the invention. FIG. 3 depicts magnetoresistive memory cell 101 at a point in the manufacturing process following a blanket implant procedure such as may be performed in step 220 of method 200. As illustrated in FIG. 3, magnetic material has been implanted in a region 310 between bit line 111 and memory element 120 and in a region 320 between memory element 120 and digit line 112. As stated above, the blanket implant enhances the magnetic permeability in regions 310 and 320 and can lead to improved device performance.

Figure 4:
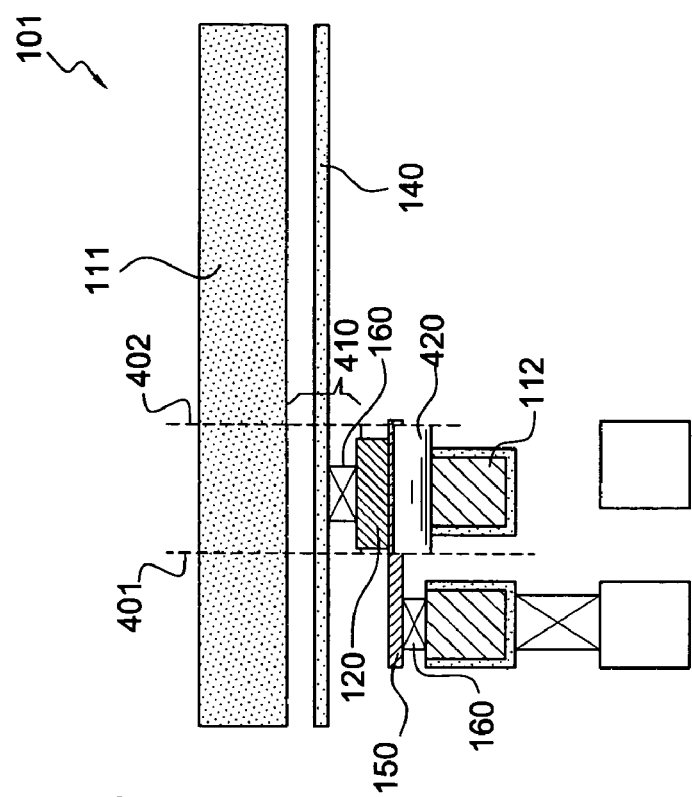
FIG. 4 is a cross sectional detail view of a portion of the magnetoelectronic device of FIG. 1 according to a different embodiment of the invention.

FIG. 4 is a cross sectional detail view of a portion of magnetoresistive memory cell 101 that was first shown in FIG. 1 according to a different embodiment of the invention. FIG. 4 depicts magnetoresistive memory cell 101 at a point in the manufacturing process following a targeted implant procedure such as may be performed in step 220 of method 200. As illustrated in FIG. 4, magnetic material has been implanted in a region 410 between bit line 111 and memory element 120 and in a region 420 between memory element 320 and digit line 112. In the illustrated embodiment, the implanted material does not extend laterally beyond a boundary line 401 on one side of memory element 120 or beyond a boundary line 402 on the other side of memory element 120.

A targeted implant resulting in a localized implant region such as that depicted in FIG. 4 can be accomplished by using appropriate patterning techniques including masking steps to define the implant regions, as known in the art. As is the case with a blanket ion implant, a targeted ion implant serves to decrease the program current required for magnetoresistive memory cell 101. A targeted implant resulting in localized regions of high magnetic permeability would also allow regions of lower magnetic permeability that would reduce magnetic coupling of neighboring devices. Another advantage of the targeted implant is that it would improve the packing density of the memory elements, thus allowing higher density memory devices. Additionally, it may be advantageous to increase the program field of reference MTJ bits as compared to target MTJ bits. This can be done by selectively placing the magnetically permeable dielectric material around the target MTJ bits while avoiding placement of the magnetically permeable material around the reference MTJ bits, thus increasing the required program fields for the reference MTJ bits and making them more resilient to program disturbs.

Figure 6:
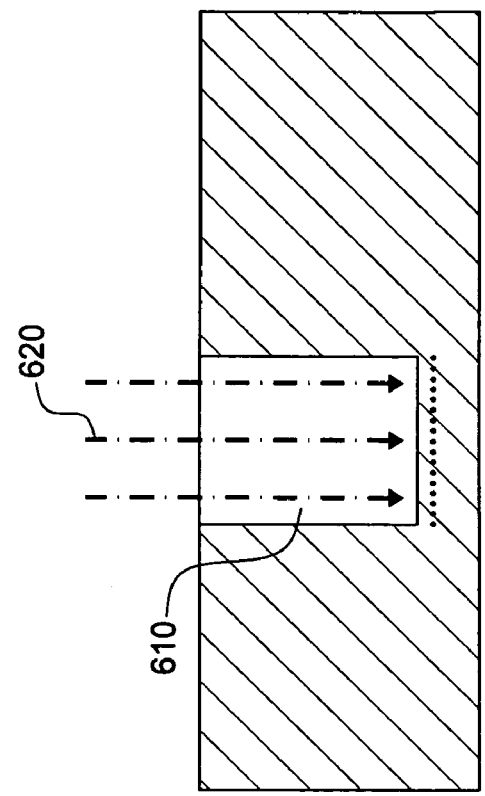
FIGS. 5 and 6 are cross sectional views showing a portion of the magnetoelectronic device of FIG. 1 according to yet another embodiment of the invention.
Figure 5:
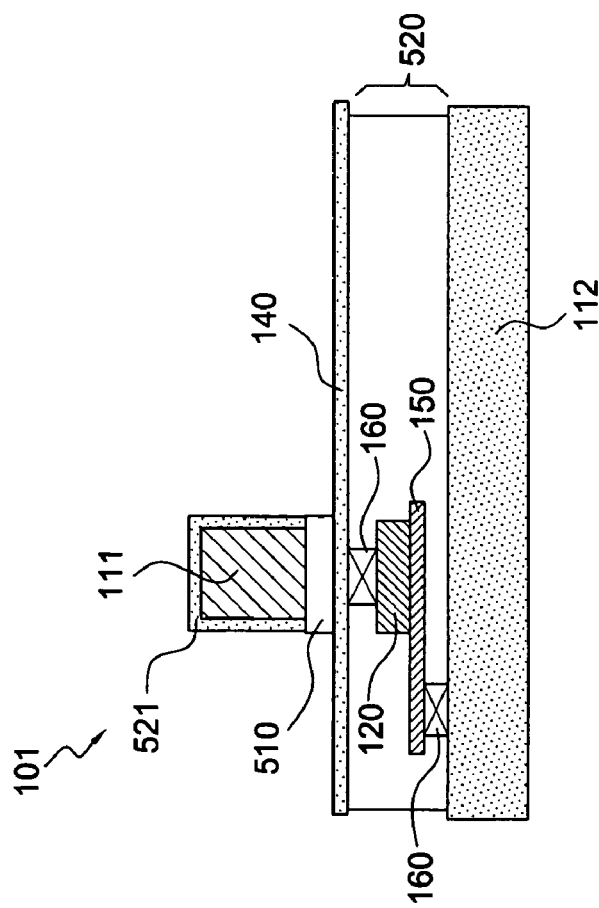

The previous paragraph made reference to masking and other patterning steps that may be used in a targeted implant of magnetic material according to embodiments of the invention. In a particular embodiment, a patterning step used in the formation of bit line 111 may also be used to define a localized implant region, thus eliminating the need for a separate masking step. This embodiment is illustrated in FIGS. 5 and 6, which are cross sectional views showing a portion of magnetoresistive memory cell 101 according to an embodiment of the invention. Note that FIG. 5 depicts a cross section of bit line 111 and a portion of a length of digit line 112, whereas in FIGS. 1, 3, and 4 the situation is reversed, with digit line 112 being depicted in cross section and bit line 111 in profile. A cladding layer 521 is shown on bit line 111 in FIG. 5.

The formation of bit line 111 includes a first step that defines a location for bit line 111. That location is shown in FIG. 6 as a trench 610. A second step forms bit line 111, such as by depositing barrier films and platting the copper or equivalent material for bit line 111. In the embodiment depicted in FIGS. 5 and 6, the targeted implant of magnetic material follows the first step but precedes the second step.

Arrows 620 in FIG. 6 represent the implant of magnetically permeable ions into trench 610. The result of such implant is shown in FIG. 5. A targeted, localized implant region 510 of magnetic material is located underneath bit line 111. A blanket region 520 of magnetic material is located between top electrode 140 and digit line 112.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the method of manufacturing a magnetoelectronic device that is discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a magnetoelectronic device, the method comprising:
providing an electrically conducting material and an electrically insulating material adjacent to at least a portion of the electrically conducting material; and
implanting a magnetic material into the electrically insulating material, wherein:
the magnetic material increases a magnetic permeability of the electrically insulating material; and
implanting the magnetic material in a concentration of between approximately 5 percent and approximately 30 percent by atomic weight of the electrically insulating material.

2. The method of claim 1 wherein:
implanting the magnetic material comprises implanting iron or an alloy thereof.

3. The method of claim 1 wherein:
implanting the magnetic material comprises implanting cobalt or an alloy thereof.

4. The method of claim 1 wherein:
implanting the magnetic material comprises implanting nickel or an alloy thereof.

5. The method of claim 1 wherein:
implanting the magnetic material comprises:
implanting a first portion of the magnetic material into the electrically insulating material; and
afterwards, implanting a second portion of the magnetic material into the electrically insulating material.

6. The method of claim 1 wherein:
implanting the magnetic material comprises:
performing a targeted implant of the magnetic material into the electrically insulating material.

7. The method of claim 1 wherein:
implanting the magnetic material comprises:
performing a blanket implant of the magnetic material into the electrically insulating material.

8. The method of claim 7 wherein:
implanting the magnetic material comprises:
implanting the magnetic material in a concentration of between approximately 15 percent and approximately 25 percent by atomic weight of the electrically insulating material.

9. A method of manufacturing a magnetoelectronic device, the method comprising:
providing an electrically conducting material and an electrically insulating material adjacent to at least a portion of the electrically conducting material; and
implanting a magnetic material into the electrically insulating material, wherein:
the magnetic material increases a magnetic permeability of the electrically insulating material; and
implanting the magnetic material comprises:
implanting the magnetic material in a concentration of at least approximately 5 percent by atomic weight of the electrically insulating material.

10. The method of claim 9 wherein:
implanting the magnetic material comprises implanting iron or an alloy thereof.

11. The method of claim 9 wherein:
implanting the magnetic material comprises implanting cobalt or an alloy thereof.

12. The method of claim 9 wherein:
implanting the magnetic material comprises implanting nickel or an alloy thereof.

13. The method of claim 9 wherein:
implanting the magnetic material comprises:
implanting the magnetic material in a concentration of at least approximately 15 percent by atomic weight of the electrically insulating material.

14. The method of claim 9 wherein:

implanting the magnetic material comprises:
   implanting the magnetic material in a concentration of between approximately 15 percent and approximately 25 percent by atomic weight of the electrically insulating material.

15. The method of claim 14 wherein:

implanting the magnetic material comprises implanting iron or an alloy thereof.

16. The method of claim 14 wherein:

implanting the magnetic material comprises implanting cobalt or an alloy thereof.

17. The method of claim 14 wherein:

implanting the magnetic material comprises implanting nickel or an alloy thereof.

18. The method of claim 9 wherein:

implanting the magnetic material comprises:
   implanting a first portion of the magnetic material into the electrically insulating material; and
   afterwards, implanting a second portion of the magnetic material into the electrically insulating material.

19. The method of claim 9 wherein:

implanting the magnetic material comprises:
   performing a targeted implant of the magnetic material into the electrically insulating material.

20. The method of claim 9 wherein:

implanting the magnetic material comprises:
   performing a blanket implant of the magnetic material into the electrically insulating material.

* * * * *